United States Patent [19]
Hotta et al.

[11] Patent Number: 6,023,096
[45] Date of Patent: Feb. 8, 2000

[54] SEMICONDUCTOR DEVICE HAVING METAL FOIL INTEGRAL WITH SEALING RESIN

[75] Inventors: Yuji Hotta; Amane Mochizuki; Michie Sakamoto; Masahiro Yoshioka, all of Osaka, Japan

[73] Assignee: Nitto Denko Corporation, Osaka, Japan

[21] Appl. No.: 09/032,758

[22] Filed: Feb. 27, 1998

[30] Foreign Application Priority Data

Mar. 1, 1997 [JP] Japan ................................ 9-061848

[51] Int. Cl.[7] .......................... H01L 23/08; H01L 23/10; H01L 23/14
[52] U.S. Cl. .......................... 257/687; 257/729; 257/787; 257/788; 257/790
[58] Field of Search ........................... 257/687, 729, 257/787, 788, 790

[56] References Cited

FOREIGN PATENT DOCUMENTS

| 4-2292316 | 12/1990 | Japan . |
| 4-4275359 | 9/1992 | Japan . |
| 7-40600 | 5/1995 | Japan . |

*Primary Examiner*—David E. Graybill
*Attorney, Agent, or Firm*—Sughrue, Mion, Zinn, Macpeak & Seas, PLLC

[57] ABSTRACT

A semiconductor device with a metal foil and a sealing resin material. Metal foil is formed integrally with the sealing resin layer.

4 Claims, 2 Drawing Sheets

SEMICONDUCTOR DEVICE HAVING METAL FOIL INTEGRAL WITH SEALING RESIN

BACKGROUND OF THE INVENTION

1. Field of the Invention

This invention relates to a manufacturing method of a semiconductor device using a wiring base material having conductor wiring on an insulating film as an electric path from a semiconductor element to the outside and the semiconductor device provided by sealing with a resin shows excellent resistance to cracks of soldering on the printed circuit board.

2. Description of the Related Art

A tape carrier type semiconductor device or a tape ball grid array type semiconductor device is known as a semiconductor device using a wiring base material having conductor wiring on an insulating film as an electric path from a semiconductor element to the outside. Further, a semiconductor device comprising a metal radiator plate brought into contact with a semiconductor element of a tape carrier type semiconductor device is also known.

FIG. 4 shows an example of the tape carrier type semiconductor device. An electrode of a semiconductor element 1' is connected with a wiring conductor 22' of a wiring base material 2' having an opening 20' by a bump method to provide a semiconductor element with a wiring base material (in FIG. 4, numeral 21' is an insulating film). Further, an electrode face side 11' of the semiconductor element 1' is sealed with a sealing resin material 41' through the opening 20' of the wiring base material 2' by a mold method, etc.

In the resin sealing, the stress acting on the sealing resin material is substantially zero when the resin is melted, namely, the state is stress-free. However, since the heat shrinkage factor of the sealing resin material is extremely large as compared with that of the semiconductor element, as the melted resin is cooled and hardened, namely, the sealing is concluded, a tension stress occurs on a sealing resin layer and finally a residual stress is contained in the sealing resin layer.

FIG. 5 shows the use state (connecting state on the printed circuit board) of the semiconductor device. The wiring conductor 22' of the wiring base material 2' in the semiconductor device is soldered to a conductor 52 formed on a based board 51 of a circuit board 5 by a flow method or a reflow method.

As known, to solder a semiconductor device sealed with a resin, it is feared that the moisture content absorbed to a sealing resin layer during the storage of the semiconductor device may be evaporated by heating at the soldering time and that cracks may occur in the sealing resin layer due to the vapor pressure. This phenomenon occurs because the strength of the sealing resin material heated to the soldering temperature (high-temperature strength) cannot endure the vapor pressure.

However, if the high-temperature strength of the sealing resin material is enhanced to prevent cracks from occurring in the sealing resin layer, the glass transition temperature of the sealing resin material rises accordingly and the moisture absorption percentage rises, leading to an unavoidable rise in the vapor pressure. On the other hand, if the moisture absorption percentage of the sealing resin material is lowered, the glass transition temperature lowers accordingly, resulting in unavoidable degradation of the high-temperature strength of the sealing resin material. Therefore, there is a limit to selection of the sealing resin material itself to prevent crack occurrence in the sealing resin layer caused by heating at the soldering time.

By the way, metal foil demonstrates extremely excellent water blocking property and is generally used as a water blocking layer of a plastic insulator, for example, a plastic power cable covered with a plastic layer to avoid the electric breakdown by absorbed water.

However, to use metal foil as a water blocking layer of the sealing resin layer of the semiconductor device, the following unreasonableness is feared:

It is inevitable that the sealing resin layer of the semiconductor device contains a tension residual stress on a mold thermal stress history as descried above. As heating of the sealing resin layer proceeds, the tension residual stress decreases and goes to a stress-free state with heating at the soldering time. Thus, thermal stress behavior of the sealing resin layer because of heating at the soldering time does not promote crack occurrence in the sealing resin layer caused by the vapor pressure; it is expected to contribute to suppression of crack occurrence.

However, assuming a structure having metal foil with zero stress or in a residual stress state not related to the residual stress laminated integrally on the sealing resin layer 41' of the semiconductor device in FIG. 4, namely, the sealing resin layer 41' in an internal dynamical state in which a tension stress caused by a mold thermal stress history remains, but decreases because of heating of soldering, the metal foil hinders the sealing resin layer from going to a stress-free state because of heating at the soldering time, resulting in a thermal stress occurring in the sealing resin layer. This thermal stress is superimposed on the stress with the vapor pressure as a load to increase the stress. If the vapor pressure can be decreased by decreasing moisture absorption due to the water blocking function of the metal foil, it is feared that the crack prevention effect in the sealing resin layer may be degraded as compared with the case where the stress increase caused by the superimposing does not occur.

SUMMARY OF THE INVENTION

It is an object of the invention to provide means for effectively providing the advantage that a residual stress caused by a mold thermal stress history of a sealing resin layer is eliminated by heating at the soldering time although a metal foil water blocking layer is used and rationally preventing the sealing resin layer from being destroyed by heating at the soldering time to suppress a phenomenon in which the sealing resin layer is destroyed at vapor pressure produced by evaporation of the absorbed moisture content at the soldering time by reducing moisture absorption owing to the water blocking function of the metal foil for a semiconductor device comprising a semiconductor element placed at the center of a wiring base material having conductor wiring on one side of an insulating film and an opening at the center, wherein electrodes of the semiconductor element and the conductor wiring are connected and wherein the opening is sealed with a sealing resin material and this sealing resin material is set (hardened) for sealing the electrode face side of the semiconductor element.

According to the present invention, there is provided a method for manufacturing a semiconductor device comprising the steps of: preparing a semiconductor element and a wiring base material having an insulating film, a conductor wiring provided on one side of the insulating film and an opening; placing the semiconductor element at a corresponding portion to the opening of the wiring base material; connecting electrodes of the semiconductor element and the conductor wiring of the wiring base material; preparing a laminate of a metal foil and a sealing resin material; abutting a sealing resin face of the laminate on the opening of the wiring base material; and heating and pressurizing the semiconductor deivce, the wiring base material and the laminate so as to seal an electrode face of the semiconducor element by the melted sealing resin material, thereby integrally forming the metal foil with the sealing resin material.

The aforementioned method preferably further comprises the steps of: forming through conductors piercing the insulating film for deriving the conductor wiring into an opposed side of the insulating film; and joining metal ball grids at a derivation ends of the through conductors so as to prepare a wiring base material with metal ball grids.

Further, in the above method, polycarbodiimide is preferably used as the sealing resin material.

The aforementioned method preferably futher comprises the steps of: preparing another laminate of a metal foil and a sealing resin material; placing the another laminate on an opposite side to the electrode face of the semiconductor element; and heating and pressurizing the sealing resin material so as to integrally form the metal foil with the sealing resin material of the another laminate.

DETAILED DESCRIPTION OF THE PREFERRED EMBODIMENTS

Referring now to the accompanying drawings, there are shown preferred embodiments of the invention.

Figure 1:
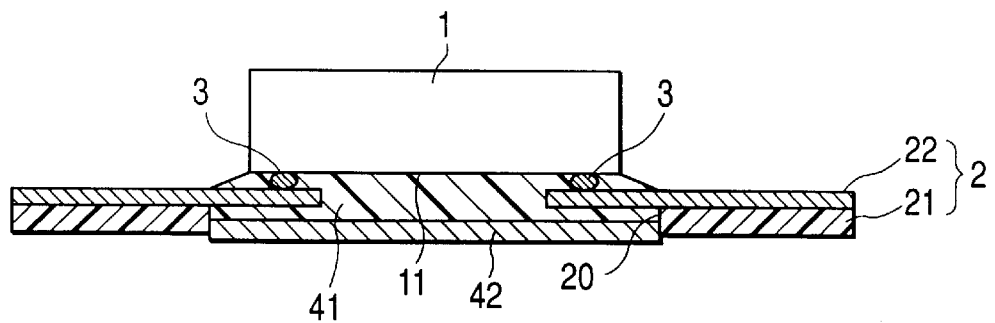
FIG. 1 is a drawing to show an example of a tape carrier type semiconductor device manufactured according to the invention.

FIG. 1 shows an example of a tape carrier type semiconductor device manufactured by a manufacturing method according to the invention.

In FIG. 1, numeral 1 is a semiconductor element and numeral 11 denotes an electrode side face. Numeral 2 is a wiring base material comprising an opening 20 at the center. The wiring base material 2 has conductor wiring 22 on one side of an insulating film 21 and electrodes of the semiconductor element 1 are connected to the conductor wiring by bump junction (indicated by numeral 3). Gold bumps or solder bumps can be used for the bumps. Numeral 41 is a sealing resin layer filled with a setting-property sealing resin material through the opening 20 and numeral 42 is metal foil integral with the sealing resin layer 41. Metal foil is placed together with an unset (unhardened) sealing resin material and they are heated and pressurized to melt the sealing resin material and fill a required space with the sealing resin material, then cooling to the room temperature is executed.

The heating temperature and time are selected appropriately, whereby the sealing resin can also be set (hardened) at the same time.

In this case, let the thickness of the semiconductor element be t1, the young's modulus of the semiconductor element be E1, the heat shrinkage factor of the semiconductor element be α1, the thickness of the sealing resin layer be t2, the young's modulus of the sealing resin layer be E2, the heat shrinkage factor of the sealing resin layer be α2, the thickness of the metal foil be t3, the young's modulus of the metal foil be E3, the heat shrinkage factor of the metal foil be α3, and the temperature difference between the heating temperature and the room temperature be ΔT. Then, the heat shrinkage factor of the sealing resin layer, α2, differs from that of the semiconductor element, α1, or that of the metal foil, α3. Thus, after the termination of resin sealing, namely, by cooling to the room temperature, tension stress δ2 remains in the sealing resin layer, compressive stress δ1 remains in the semiconductor element, and compressive stress δ3 indicated by the following expressions (1)–(3) remains in the metal foil.

$$\delta 3 = \Delta T \cdot A/B \tag{1}$$

where $$A = [(\alpha 1 - \alpha 3)t1E1/t2E2 - (\alpha 2 - \alpha 3)] \tag{2}$$

$$B = [1/E2 \cdot (t3/t2 + t1E1/t2E2) - 1/E3] \tag{3}$$

In the semiconductor device manufactured according to the invention, the metal foil 42 serves as a water blocking layer during the storage of the semiconductor device, so that moisture absorption of the sealing resin layer 41 can be lessened, the water content evaporated by heating at the reflow or flow soldering time can be decreased, and the generated vapor pressure can be decreased. The residual stress δ2 of the sealing resin layer 41 decreases due to heating at the soldering time and goes to a state free of thermal stress. Therefore, if a stress occurs on the sealing resin layer 41 due to the effect of the vapor pressure, a severe stress state produced by a thermal stress superimposed on the stress can be avoided and the moisture absorption amount of the sealing resin layer 41 can be sufficiently decreased owing to the water blocking function of the metal foil 42, lowering the vapor pressure. Thus, crack destruction caused by moisture absorption of the sealing resin layer 41 can be prevented effectively.

The reason why the effect is produced in the semiconductor device manufactured according to the invention is that the compressive stress δ3 indicated by expressions (1)–(3) remains in the metal foil 42 because of the mold thermal stress history of the sealing resin layer 41 with which the metal foil 42 is integral. If the residual stress in the metal foil 42 is zero or a stress beyond expression (3), the metal foil 42 causes a thermal stress to be generated on the sealing resin layer 41; the effect cannot be produced.

To manufacture the semiconductor device shown in FIG. 1 by the manufacturing method according to the invention, carrier tape is run intermittently, connect the electrodes of the semiconductor element to the conductor wiring of the carrier tape by bump connection at a semiconductor element mount stage, the metal foil together with the sealing resin material is placed in the opening below the mount element at a resin sealing stage, as the sealing resin material is set (hardened), the metal foil is integrated with the sealing resin layer, and the carrier tape is punched at a punching stage; this sequence is executed while the carrier tape is being sent intermittently. The semiconductor element may be disposed on the conductor side of the wiring base material as shown in FIG. 1 or may be placed on the insulating film side.

Figure 2:
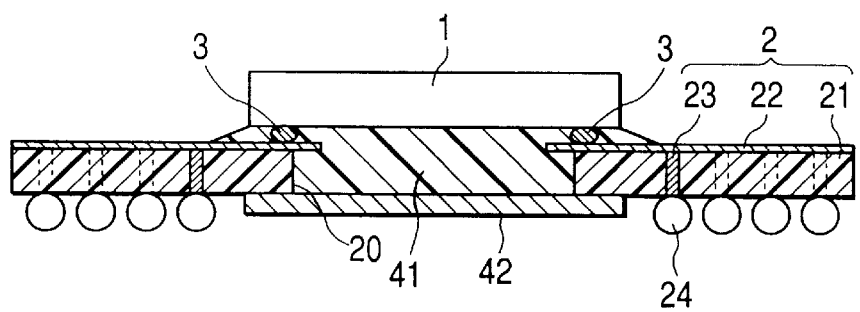
FIG. 2 is a drawing to show an example of a tape ball grid array type semiconductor device manufactured according to the invention.

The invention can also be applied to manufacturing of a tape ball grip array type semiconductor device as shown in FIG. 2.

In FIG. 2, numeral 2 denotes a wiring base material with metal ball grids; conductor wiring 22 on one side of an insulating film 21 is derived to the other side of the insulating film 21 through a through conductor 23 and gold or solder ball grids 24 are joined to the derivation end.

Parts identical with those previously described with reference to FIG. 1 are denoted by the same reference numerals in FIG. 2. In FIG. 2, numeral 1 is a semiconductor element, numeral 3 is a bump junction part, and numeral 20 is an opening of the wiring base material. Numeral 41 is a sealing resin layer filled with a setting-property sealing resin material through the opening 20 and numeral 42 is metal foil integral with the sealing resin layer 41. The metal foil 42 is placed together with an unset (unhardened) sealing resin material and the sealing resin material is heated and once melted and is heated and set (hardened) for a predetermined time, then is cooled to the room temperature.

Figure 3:
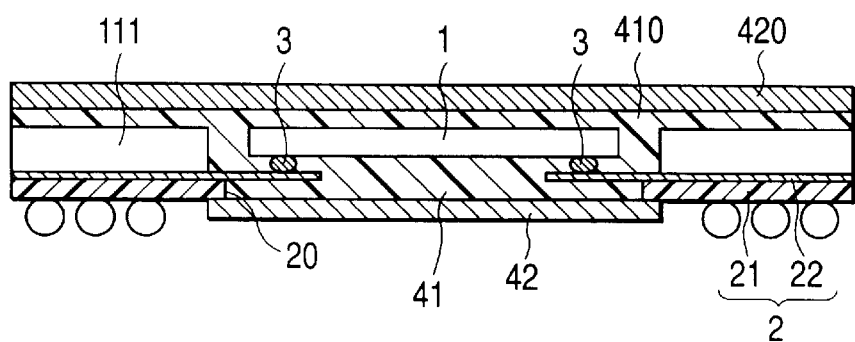
FIG. 3 is a drawing to show another example of a tape ball grid array type semiconductor device manufactured according to the invention.
Figure 4:
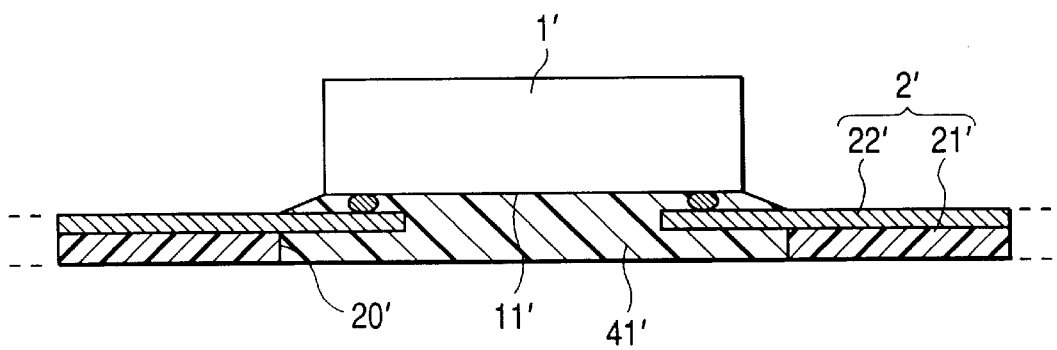
FIG. 4 is a drawing to show an example of a conventional tape carrier type semiconductor device.
Figure 5:
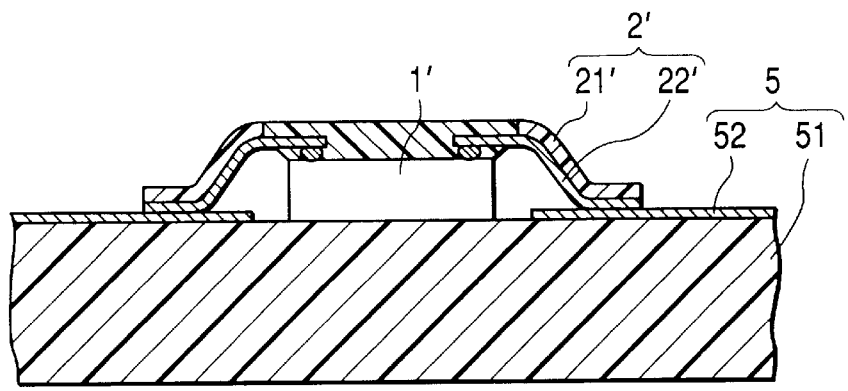
FIG. 5 is a drawing to show a packaging state of the conventional tape carrier type semiconductor device.

FIG. 3 shows another tape ball grid array type semiconductor device manufactured according to the invention. An unset (unhardeded) sealing resin material and metal foil 42 are placed in an opening 20 of a wiring base material 2 with metal ball grids on which a semiconductor element 1 is mounted by bump junction 3, and a high-rigidity insulating spacer 111 such as epoxy resin impregnated glass cloth, a metal plate with an insulating adhesive, or the like is placed surrounding the semiconductor element 1 on one side of the wiring base material 2. Further, an unset (unhardened) sealing resin material and metal foil 420 are placed covering the insulating spacer 111 on the surface of the semiconductor element 1 (face opposite to the electrode side face) and both sealing resin materials are heated and pressurized at the same time for sealing the semiconductor element with a sealing resin layers 41, 410 integrated with metal foil 42, 420 from both faces.

In the invention, to form the sealing resin layer integral with metal foil, a laminate of metal foil and unset (unhardened) sealing resin material is used and the unset (unhardened) sealing resin material face is abutted on the sealed face, is heated and pressurized, and set (hardened). For the semiconductor devices shown in FIGS. 1 and 2, filling with resin can also be executed by depressurization and suction from the opposite side to the electrode side face of the semiconductor element 1 in addition to mounting and pressurization from the electrode side face. Without using the laminate of metal foil and sealing resin material, they may be provided separately and heated and pressurized at the same time for integration.

In the invention, the sealing resin layer generally is 80–400 μm thick and an epoxy resin, a polyester resin, a polyimide resin, etc., can also be used as the sealing resin layer material; particularly, a polycarbodiimide provided by methods disclosed in Japanese Patent Publication Nos. Hei. 2-292316 and 4-275359 has characteristics of low moisture absorption, flexibility, high adhesion, high heat resistance, etc., and is preferred. A filler, a coupling material, a pigment, a fire retardant, a viscosity modifier, a thermosetting material composition, etc., can be added to the sealing resin materials as required. The filler addition mount is within 90 wt % and a preferred filler is molten silica articles. Preferably, the sealing resin material is used like a sheet for convenience, but can also be used like paste.

In the invention, preferably the metal foil used to seal the opening of the wiring base material is of plane dimensions capable of completely closing the opening, but if the metal foil covers at least 50%–70% of the opening, the object of the invention can be accomplished. If the metal foil is too thin, it is disadvantageous in handling; if the metal foil is too thick, the semiconductor device is thickened. Thus, preferably the metal foil is 30–300 μm thick. To enhance the bond strength to the sealing resin layer, an undercoat 0.1–50 μm thick may be applied to the metal foil. As its material, for example, heat-resistant organic material of an epoxy resin, polyimide, a carbodiimide resin, polyetherimide, etc., can be named.

The metal foil material used in the invention is not limited if it is resistant to corrosion; for example, Al, Cu, 50Ni-iron, 42Ni-iron, etc., can be named. Particularly, if a magnet is used, it is convenient for temporarily fixing the metal foil, for example, onto a metal mold cavity face.

In the invention, a heat-resistant film such as a polyimide film, a polyester film, a polysulfone film, or a glass-cloth-impregnated epoxy resin tissue material 15–150 μm thick can be used for the insulating film of the wiring base material. To form the conductor wiring of the wiring base material, a method of sticking metal foil and insulating film on each other, then etching the metal foil to a predetermined wiring pattern, a method of applying varnish of insulating film material to metal foil, drying a solvent, and forming an insulating film on the metal foil, then etching the metal foil to a predetermined wiring pattern, a method of depositing thin conductor wiring on insulating film by electroless plating, then accumulating a thick conductor wiring on the thin conductor wiring by electric plating, or the like can be used. Usually, copper is used as conductor wiring material and the conductor normally is 15–80 μm thick.

FIRST EXAMPLE

An epoxy sealing resin comprising a bisphenol A epoxy resin and a tetrahydrophthalic anhydride was used as a sealing resin material and a coat of the epoxy sealing resin 250 μm thick was applied to copper foil 35 μm thick to produce an epoxy sealing resin and copper foil laminate.

A manufactured semiconductor device has the configuration shown in FIG. 3. A semiconductor element about 6 mm×6 mm was mounted by bump junction on conductor wiring of ball grid array tape before a wiring base material is punched. An epoxy sealing resin and copper foil laminate 10 mm×10 mm was abutted on an opening of the ball grid array tape on the electrode side of the semiconductor element on the epoxy sealing resin face and an epoxy sealing resin and copper foil laminate 20 mm×20 mm was abutted on the opposite face to the electrode side of the semiconductor element on the epoxy sealing resin face. By heating and pressurizing, a required space was filled with the epoxy sealing resin and further the resin was set (hardened) under the condition of 180° C. and two hours.

First Comparative Example

A first comparative example was the same as the first example except that copper foil was not used.

Second Comparative Example

A manufactured semiconductor device from the first comparative example was covered with copper foil by epoxy bonding example.

To evaluate crack resistance of the sealing resin layer at the soldering time for the example and comparative example articles (the number of specimens is each 10), the specimens were left alone for 480 hours at a temperature of 85° C. and a humidity of 85%, then were heated with vapor at 215° C. and whether or not cracks occurred was checked. No cracks were observed on the example articles. In contrast, cracks were recognized on five of the ten articles in the first comprative example and two of the ten articles in the second comparative example.

From the test results, particularly from the comparison between the test results of the first example and the second comprative example, it can be estimated that the semiconductor device according to the invention can well exclude occurrence of a thermal stress in the sealing resin layer at the soldering heating time although the metal foil is integrated to provide the advantage of a mold thermal stress history of sealing resin material (residual stress in the sealing resin layer goes to a stress-free state by heating at the soldering time) and that the effect is reflected on improvement in crack resistance.

In the first example, the sealing resin can be pressurized efficiently with the metal foil as a plane plate and voids can be removed; from the aspect, moisture absorption can be lessened, crack resistance can be improved, and productivity can be made excellent.

Second Example

A polycarbodiimide composition was used as a sealing resin material and to compound the polycarbodiimide composition, 2, 2-bis [4-(4-isocyanate phenoxy) phenyl] hexafluoropropane 500 g, tetrahydrofuran 2500 milliliters, and a carbodiimide catalyst 1.35 g were poured into a 5000-milliliter four-necked flask comprising a thermometer, an agitator, and a calcium chloride tube and were agitated at 60° C. for 6.5 hours to produce a polycarboimide solution having molecular weight of about 8,300. This reaction liquid was poured into isopropyl alcohol and a precipitated polymer was isolated by filtering and was dried, thereby producing a polycarbodiimide composition.

A manufactured semiconductor device has the configuration shown in FIG. 1. A semiconductor element about 6 mm×6 mm was mounted by bump junction on conductor wiring of carrier tape before a wiring base material is punched. A polycarbodiimide sealing resin and copper foil laminate with plane dimensions 7 mm×7 mm, resin thickness 250 $\mu$m, and copper foil thickness 150 $\mu$m was abutted on an opening of the carrier tape on the electrode side of the semiconductor element on the resin face. By heating and pressurizing, a required space was filled with the sealing resin and further the resin was set (hardened) under the condition of 250° C. and 30 minutes.

Third Example

A third example is the same as the second example except that molten silica having an average particle diameter of 3 $\mu$m was added in an amount of 60% by weight to a polycarbodiimide composition, that a tape ball grid array was used for a wiring base material, or that copper foil having plane dimensions 8×8 mm and being 75 $\mu$m thick was used.

The second or third example demonstrates crack resistance in soldering equal to that of the first embodiment with both sides sealed owing to excellent low moisture absorption of the polycarbodiimide sealing resin although only the electrode face side of the semiconductor element is sealed.

According to the invention, the advantage of a mold thermal stress history of the sealing resin layer, namely, the advantage that the residual stress in the sealing resin layer goes to a stress-free state can be held although metal foil is integrated on the outer face of the sealing resin layer of the semiconductor device for providing a water blocking layer. Thus, moisture absorption of the sealing resin layer can be decreased owing to the metal foil water blocking layer and in addition, from the thermal stress aspect, crack destruction of the sealing resin layer caused by superimposing thermal stress and vapor pressure stress occurring as the absorbed moisture content of the sealing resin layer is heated at the soldering time can be suppressed efficiently.

What is claimed is:

1. A semiconductor device comprising:

a wiring base material having an insulating film and a conductor wiring laminated on one side of said insulating film, an opening being formed at a center of said wiring base material;

a semiconductor element provided at the center of said wiring base material and having electrodes connected with said conductor wiring; and a sealing resin material for sealing the opening and an electrode face of the semiconductor element; and a metal foil integrally formed with an outer surface of said sealing resin material.

2. The semiconductor device according to claim 1, wherein said wiring base material further comprises through conductors piercing the insulating film for deriving the conductor wiring into an opposed side of the insulating film, and metal ball grids joined at derivation ends of said through conductors.

3. The method for manufacturing a semiconductor device according to claim 1, wherein said sealing resin material comprises polycarbodiimide.

4. The semiconductor device according to claim claim 1, further comprising another sealing resin material for sealing an opposite side to the electrode face of the semiconductor element, and another metal foil integrally formed with an outer surface of said another sealing resin material.

* * * * *